(12) United States Patent
Zheng et al.

(10) Patent No.: US 10,290,261 B2
(45) Date of Patent: May 14, 2019

(54) SHIFT REGISTER UNIT, ITS DRIVING METHOD, GATE DRIVER CIRCUIT AND DISPLAY DEVICE

(71) Applicant: BOE TECHNOLOGY GROUP CO., LTD., Beijing (CN)

(72) Inventors: Can Zheng, Beijing (CN); Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 134 days.

(21) Appl. No.: 15/300,930

(22) PCT Filed: Sep. 24, 2015

(86) PCT No.: PCT/CN2015/090500
§ 371 (c)(1),
(2) Date: Sep. 30, 2016

(87) PCT Pub. No.: WO2016/183994
PCT Pub. Date: Nov. 24, 2016

(65) Prior Publication Data
US 2018/0174521 A1   Jun. 21, 2018

(30) Foreign Application Priority Data

May 21, 2015   (CN) .......................... 2015 1 0263912

(51) Int. Cl.
*G09G 3/36* (2006.01)
*G09G 3/3266* (2016.01)
(Continued)

(52) U.S. Cl.
CPC ............. *G09G 3/3266* (2013.01); *G09G 3/20* (2013.01); *G09G 3/3674* (2013.01);
(Continued)

(58) Field of Classification Search
CPC .. G09G 3/3266; G09G 3/3275; G09G 3/3674;
G09G 3/3677; G09G 3/3696;
(Continued)

(56) References Cited

U.S. PATENT DOCUMENTS 9,071,230 B2 *   6/2015   Kim ........................ H03K 3/012
9,368,230 B2 *   6/2016   Yao ........................ G11C 19/184
(Continued)

FOREIGN PATENT DOCUMENTS

CN   101242178 A   8/2008
CN   103151077 A   6/2013
(Continued)

OTHER PUBLICATIONS

International Search Report and Written Opinion for Application No. PCT/CN2015/090500, dated Feb. 24, 2016, 12 Pages.
(Continued)

*Primary Examiner* — Roberto W Flores
(74) *Attorney, Agent, or Firm* — Brooks Kushman P.C.

(57) ABSTRACT

The present disclosure provides a shift register unit, its driving method, a gate driver circuit and a display device. The shift register unit includes a first output module, a second output module, an input module and a control module. The first output module is connected to a first signal end, a first node and an output end. The second output module is connected to the output end, a second node and a second signal end. The control module is connected to the first node, the second node, the first signal end, the second signal end, a first clock signal end and a second clock signal end. The input module is connected to an input end, the second node and the second clock signal end.

17 Claims, 7 Drawing Sheets

(51) Int. Cl.
*G09G 3/20* (2006.01)
*G11C 19/28* (2006.01)
*G11C 19/18* (2006.01)

(52) U.S. Cl.
CPC ............ *G11C 19/184* (2013.01); *G11C 19/28* (2013.01); *G09G 2310/0286* (2013.01); *G09G 2310/061* (2013.01); *G09G 2310/08* (2013.01)

(58) Field of Classification Search
CPC ... G09G 2310/06–2310/08; G09G 2310/0286; G09G 2310/0289; G09G 2310/0294; G11C 29/86; G11C 29/20
See application file for complete search history.

(56) References Cited

U.S. PATENT DOCUMENTS

| | | | | |
|---|---|---|---|---|
| 9,620,073 | B2* | 4/2017 | Hao | G09G 3/3677 |
| 2007/0296662 | A1 | 12/2007 | Lee et al. | |
| 2008/0012816 | A1* | 1/2008 | Moon | G11C 19/184 |
| | | | | 345/100 |
| 2008/0187089 | A1 | 8/2008 | Miyayama et al. | |
| 2008/0266477 | A1* | 10/2008 | Lee | G09G 3/3677 |
| | | | | 349/46 |
| 2009/0273552 | A1* | 11/2009 | Hwang | G09G 3/3677 |
| | | | | 345/89 |
| 2010/0158188 | A1* | 6/2010 | Lee | G09G 3/3677 |
| | | | | 377/79 |
| 2010/0164854 | A1 | 7/2010 | Kim et al. | |
| 2011/0102398 | A1* | 5/2011 | Han | H03K 3/356139 |
| | | | | 345/209 |
| 2011/0273407 | A1* | 11/2011 | Chung | G09G 3/3266 |
| | | | | 345/204 |
| 2011/0304604 | A1* | 12/2011 | Jo | G09G 3/3677 |
| | | | | 345/212 |
| 2012/0062545 | A1* | 3/2012 | Kim | G09G 3/3233 |
| | | | | 345/212 |
| 2012/0081409 | A1* | 4/2012 | Chung | G09G 3/3266 |
| | | | | 345/690 |
| 2012/0176417 | A1* | 7/2012 | Jang | G09G 3/3266 |
| | | | | 345/690 |
| 2012/0269315 | A1* | 10/2012 | Jang | G11C 19/28 |
| | | | | 377/75 |
| 2013/0002306 | A1* | 1/2013 | Chung | G09G 3/3266 |
| | | | | 327/108 |
| 2013/0088480 | A1* | 4/2013 | Hong | G09G 3/3677 |
| | | | | 345/212 |
| 2013/0328495 | A1* | 12/2013 | Woo | H05B 37/02 |
| | | | | 315/224 |
| 2014/0055444 | A1* | 2/2014 | Jang | G09G 3/3291 |
| | | | | 345/213 |
| 2014/0169518 | A1* | 6/2014 | Kong | G09G 3/3674 |
| | | | | 377/64 |
| 2015/0009113 | A1 | 1/2015 | Zeng et al. | |
| 2015/0043703 | A1* | 2/2015 | Tan | G11C 19/28 |
| | | | | 377/68 |
| 2015/0206490 | A1* | 7/2015 | Lim | G09G 3/3677 |
| | | | | 345/92 |
| 2015/0255031 | A1* | 9/2015 | Cao | G09G 3/3648 |
| | | | | 345/210 |
| 2015/0348596 | A1* | 12/2015 | Yao | G09G 3/20 |
| | | | | 377/54 |
| 2016/0180800 | A1 | 6/2016 | Zheng | |
| 2016/0210890 | A1* | 7/2016 | Lim | G09G 3/20 |
| 2016/0217728 | A1* | 7/2016 | In | G09G 3/3275 |
| 2016/0218707 | A1* | 7/2016 | Park | G09G 3/3677 |
| 2016/0240129 | A1* | 8/2016 | Kim | G09G 3/2092 |
| 2016/0300542 | A1 | 10/2016 | Zhang et al. | |

FOREIGN PATENT DOCUMENTS

| | | |
|---|---|---|
| CN | 104299594 A | 1/2015 |
| CN | 104299595 A | 1/2015 |
| CN | 104464628 A | 3/2015 |
| CN | 104537980 A | 4/2015 |
| CN | 104809978 A | 7/2015 |

OTHER PUBLICATIONS

International Search Report and Written Opinion, English Translation.
CN101242178A, English Abstract and U.S. Equivalent U.S. Pub. No. 2008/187089.
CN103151077A, English Abstract and Translation.
CN104299594A, English Abstract and U.S. Equivalent U.S. Pub. No. 2016/300542.
CN104299595A, English Abstract and Translation.
CN104464628A, English Abstract and U.S. Equivalent U.S. Pub. No. 2016/180800.
CN104537980A, English Abstract and Translation.
CN104809978A, English Abstract and Translation.

* cited by examiner

SHIFT REGISTER UNIT, ITS DRIVING METHOD, GATE DRIVER CIRCUIT AND DISPLAY DEVICE

CROSS-REFERENCE TO RELATED APPLICATION

This application is the U.S. national phase of PCT Application No. PCT/CN2015/090500 filed on Sep. 24, 2015, which claims priority to Chinese Application No. 201510263912.2 filed on May 21, 2015, the disclosures of which are incorporated in their entirety by reference herein.

TECHNICAL FIELD

The present disclosure relates to the field of display technology, in particular to a shift register unit, its driving method, a gate driver circuit and a display device.

BACKGROUND

High-resolution and narrow-bezel display has become a research hotspot in the field of display technology, so as to improve the image display as well as the user experience. However, along with the increase in the number of pixels, a shift register (a gate switch circuit) needs to scan more rows of pixels within one frame. At this time, it is required to provide a smaller layout area of a shift register unit, and simplify a circuit structure.

Usually, a conventional shift register unit is used to control a potential of an output signal through a plurality of transistors and a plurality of capacitors.

During the implementation, the inventor found that there is at least the following defect in the conventional shift register unit. The circuit structure of the conventional shift register unit and a control procedure thereof are relatively complex, so it is impossible for the conventional shift register unit to adjust an output pulse width.

SUMMARY

An object of the present disclosure is to provide a shift register unit, its driving method, a gate driver circuit and a display device, so as to simplify the shift register unit and its control procedure, thereby to adjust the output pulse width.

In one aspect, the present disclosure provides in some embodiments a shift register unit, including a first output module, a second output module, an input module and a control module. The first output module is connected to a first signal end, a first node and an output end, and configured to output a first control signal from the first signal end to the output end under the control of the first node. The second output module is connected to the output end, a second node and a second signal end, and configured to output a second control signal from the second signal end to the output end under the control of the second node. The control module is connected to the first node, the second node, the first signal end, the second signal end, a first clock signal end and a second clock signal end, and configured to control potentials at the first node and the second node under the control of the first control signal from the first signal end, the second control signal from the second signal end, a first clock signal from the first clock signal end and a second clock signal from the second clock signal end. The output module is connected to an input end, the second node and the second clock signal end, and configured to output an input signal from the input end to the second node under the control of the second clock signal from the second clock signal end.

Optionally, the first output module includes a first transistor and a first capacitor. A first electrode of the first transistor is connected to the first signal end, a second electrode thereof is connected to the output end, and a third electrode thereof is connected to the first node. A first electrode of the first capacitor is connected to the first electrode of the first transistor, and a second electrode thereof is connected to the third electrode of the first transistor.

Optionally, the second output module includes a second transistor and a third capacitor. A first electrode of the second transistor is connected to the second signal end, a second electrode thereof is connected to the output end, and a third electrode thereof is connected to the second node. A first electrode of the third capacitor is connected to the second electrode of the second transistor, and a second electrode thereof is connected to the third electrode of the second transistor.

Optionally, the control module includes a pull-up control sub-module and a reset sub-module. The pull-up control sub-module is connected to the first clock signal end, the second clock signal end, the second signal end, the first node and a third node, and configured to control the potential at the first node under the control of the second control signal from the second signal end, a reset control signal from the third node, the first clock signal from the first clock signal end and the second clock signal from the second clock signal end. The reset sub-module is connected to the first node, the second node, the third node, the first signal end and the second clock signal end, and configured to control the potentials at the first node, the second node and the third node, under the control of the first control signal from the first signal end and the second clock signal from the second clock signal end.

Optionally, the pull-up control sub-module includes a second capacitor, a seventh transistor, an eighth transistor and a ninth transistor. A first electrode of the seventh transistor is connected to a fourth node, a second electrode thereof is connected to the first node, and a third electrode thereof is connected to the first clock signal end. A second electrode of the eighth transistor is connected to the fourth node, a first electrode thereof is connected to the first clock signal end, and a third electrode thereof is connected to the third node. A second electrode of the ninth transistor is connected to the third node, a first electrode thereof is connected to the second signal end, and a third electrode thereof is connected to the second clock signal end. A first electrode of the second capacitor is connected to the third node, and a second electrode thereof is connected to the fourth node.

Optionally, the reset sub-module includes a fourth transistor, a fifth transistor and a sixth transistor. A second electrode of the fourth transistor is connected to the first node, a first electrode thereof is connected to the first signal end, and a third electrode thereof is connected to the second node. A first electrode of the fifth transistor is connected to the second node, a second electrode thereof is connected to a third electrode of the sixth transistor, and a third electrode thereof is connected to the second clock signal end. A second electrode of the sixth transistor is connected to the third node, and a first electrode thereof is connected to the first signal end.

Optionally, the input module includes a third transistor, a second electrode of which is connected to the second node, a first electrode of which is connected to the input end, and a third electrode of which is connected to the second clock signal end.

Optionally, the transistors are all P-type transistors.

In another aspect, the present disclosure provides in some embodiments a method for driving the above-mentioned shift register unit, the shift register unit including a first output module, a second output module, an input module and a control module. The method includes steps of: at a first stage, enabling an input signal from an input end to be at a first potential, enabling a second clock signal from a second clock signal end to be at a second potential, and enabling the input module to input the input signal to a second node under the control of the second clock signal from the second clock signal end; at a second stage, enabling a first clock signal from a first clock signal end to be at the second potential, enabling the second clock signal from the second clock signal end to be at the first potential, enabling the control module to input the first clock signal form the first clock signal end to a first node, and enabling the first output module to input a first control signal from a first signal end to an output end under the control of the first node; at a third stage, maintaining the second node at the first potential, and enabling the second output module, the input module and the control module to repeat the steps at the first stage and the second stage; and at a fourth stage, enabling the input module to input the input signal at the second potential from the input end to the second node under the control of the second clock signal from the second clock signal end, and under the control of the second node, enabling the second output module to input a second control signal from a second signal end to the output end and enabling the control module to input the first control signal from the first signal end to the first node.

Optionally, the first output module includes a first transistor and a first capacitor. At the second stage, the control module is configured to input the first clock signal at the second potential from the first clock signal end to the first node, so as to turn on the first transistor and charge the first capacitor, thereby to enable the first transistor to input the first control signal from the first signal end to the output end. At the fourth stage, the control module is configured to input the first control signal from the first signal end to the first node, so as to turn off the first transistor.

Optionally, the second output module includes a second transistor and a third capacitor. At the first stage, the input module is configured to output the input signal at the first potential from input end to the second node, so as to turn off the second transistor and charge the third capacitor. At the fourth stage, the input module is configured to output the input signal at the second potential from the input end to the second node, so as to turn on the second transistor, thereby to enable the second transistor to output the second control signal from the second signal end to the output end.

Optionally, the control module includes a pull-up control sub-module and a reset sub-module. At the second stage, the first clock signal end is configured to input the first clock signal at the second potential, and the second clock signal end is configured to input the second clock signal at the first potential, so as to enable the pull-up control sub-module to reset the first node to be at the second potential. At the fourth stage, the input end is configured to input the input signal at the second potential, so as to enable the reset sub-module to input the first control signal from the first signal end to a third node.

Optionally, the pull-up control sub-module includes a second capacitor, a seventh transistor, an eighth transistor and a ninth transistor. At the first stage, the second clock signal end is configured to input the second clock signal at the second potential, so as to turn on the ninth transistor, thereby to enable the second signal end to input the second control signal to the third node. At the second stage, the first clock signal end is configured to input the first clock signal at the second potential, and the second clock signal end is configured to input the second clock signal at the first potential, so as to turn off the ninth transistor, and turn on the seventh transistor and the eighth transistor, thereby to enable the first clock signal end to input the first clock signal to a fourth node, enable the fourth node to reset the first node to be at the second potential, and turn off the seventh transistor after the first clock signal from the first clock signal end is jumped to be at the first potential.

Optionally, the reset sub-module includes a fourth transistor, a fifth transistor and a sixth transistor. At the fourth stage, the second clock signal end is configured to input the second clock signal at the second potential, and the input module is configured to input the input signal at the second potential from the input end to the second node, so as to turn on the fourth transistor, the fifth transistor and the sixth transistor, thereby to enable the first signal end to input the first control signal to the first node and the third node.

Optionally, the input module includes a third transistor. At the first stage, the input end is configured to output the input signal at the first potential, and the second clock signal end is configured to input the second clock signal at the second potential, so as to turn on the third transistor, thereby to enable the third transistor to input the input signal from the input end to the second node. At the third stage, before the input signal from the input end is jumped to be at the second potential, the third transistor is turned off under the control of the second clock signal at the first potential from the second clock signal end. At the fourth stage, the second clock signal end is configured to input the second clock signal at the second potential, so as to enable the third transistor to output the input signal at the second potential from the input end to the second node under the control of the second clock signal at the second potential from the second clock signal end, and turn off the third transistor in the case that the second clock signal from the second clock signal end is jumped to be at the first potential.

Optionally, the transistors are all P-type transistors.

Optionally, the first potential is a high potential relative to the second potential.

In yet another aspect, the present disclosure provides in some embodiments a gate driver circuit including at least two above-mentioned shift register units connected to each other in a cascaded manner.

In still yet another aspect, the present disclosure provides in some embodiments a display device including the above-mentioned gate driver circuit.

According to the embodiments of the present disclosure, the potentials at the output end are controlled by the first output module, the second output module, the input module and the control module. As a result, it is able to simplify the shift register unit and its control procedure, thereby to adjust the output pulse width.

It should be appreciated that, the above-mentioned general description and the following details are for illustrative and explanatory purposes only, but shall not be used to limit the scope of the present disclosure.

BRIEF DESCRIPTION OF THE DRAWINGS

The drawings herein are incorporated into, and constitute a part of, the specification, so as to show the embodiments of the present disclosure and explain the principles of the present disclosure in conjunction with the specification.

Figure 1:
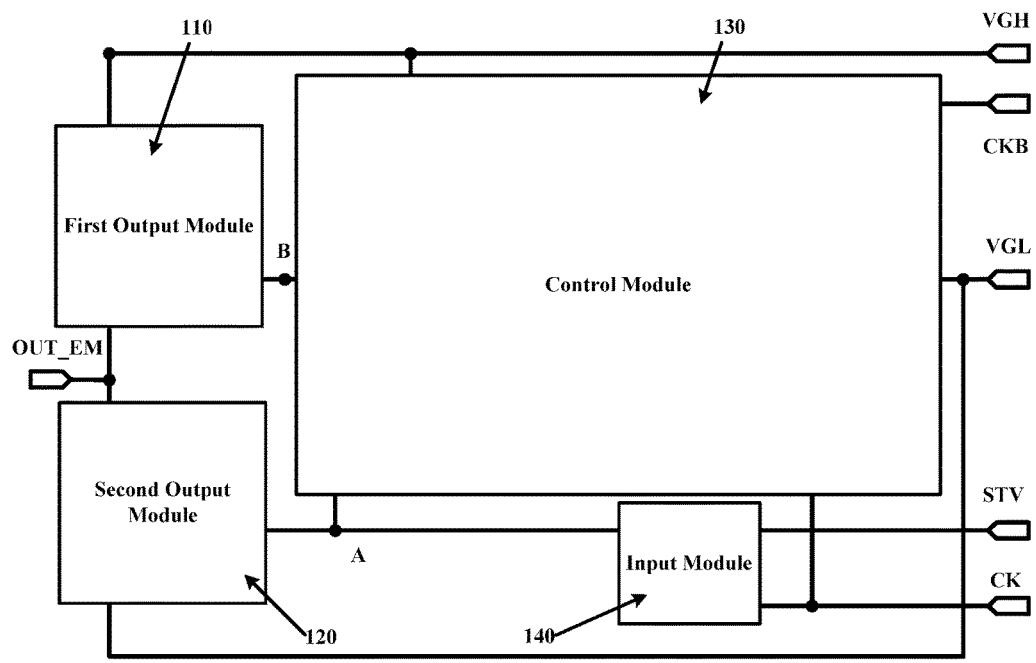
FIG. 1 is a schematic view showing a shift register unit according to one embodiment of the present disclosure.

The above drawings show the embodiments of the present disclosure, which will be described in more details hereinafter. The drawings and the description thereof shall not be used to limit the scope of the present disclosure in any way, but are used to illustrate the concepts of the present disclosure with reference to the specific embodiments.

DETAILED DESCRIPTION OF THE EMBODIMENTS

The present disclosure will be described hereinafter in conjunction with the drawings and embodiments. In the drawings, unless otherwise specified, an identical numeral represents an identical or similar element. The following embodiments are merely parts of the embodiments of the present disclosure, i.e., they merely relate to some examples of the devices and methods described in the appended claims.

All transistors used in the embodiments of the present disclosure may be thin film transistors (TFTs), field effect transistors (FETs) or any other elements having the same characteristics. Depending on their functions in the circuit, these transistors are principally switch transistors. Because a source electrode of each switch transistor is symmetrical to its drain electrode, they may be replaced with each other. In the embodiments of the present disclosure, the source electrode is called as a first electrode, the drain electrode is called as a second electrode, and a gate electrode is called as a third electrode. In addition, each switch transistor used in the embodiments of the present disclosure is usually a P-type switch transistor, which is turned on in the case that the gate electrode is at a low level and which is turned off in the case that the gate electrode is at a high level. Further, each signal used in the embodiments of the present disclosure may be at a first potential and a second potential. The first potential and the second potential are merely used to represent two states of each signal, but shall not be used to represent specific values. For example, a first control signal may be a signal at a high potential, and a second control signal may be a signal at a low potential.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

As shown in FIG. 1, which is a schematic view showing a shift register unit according to one embodiment of the present disclosure, the shift register unit may include a first output module 110, a second output module 120, a control module 130 and an input module 140. The first output module 110 is connected to a first signal end VGH, a first node B and an output end OUT_EM, and configured to output a first control signal from the first signal end VGH to the output end OUT_EM under the control of the first node B. The second output module 120 is connected to the output end OUT_EM, a second node A and a second signal end VGL, and configured to output a second control signal from the second signal end VGL to the output end OUT_EM under the control of the second node A. The control module 130 is connected to the first node B, the second node A, the first signal end VGH, the second signal end VGL, a first clock signal end CKB and a second clock signal end CK, and configured to control potentials at the first node B and the second node A under the control of the first control signal from the first signal end VGH, the second control signal from the second signal end VGL, a first clock signal from the first clock signal end CKB and a second clock signal from the second clock signal end CK. The output module 140 is connected to an input end STV, the second node A and the second clock signal end CK, and configured to output an input signal from the input end STV to the second node A under the control of the second clock signal from the second clock signal end CK.

According to the shift register unit in the embodiments of the present disclosure, the potentials at the output end is controlled by the first output module, the second output module, the input module and the control module. As a result, it is able to simplify the shift register unit and its control procedure, thereby to adjust the output pulse width.

Figure 2:
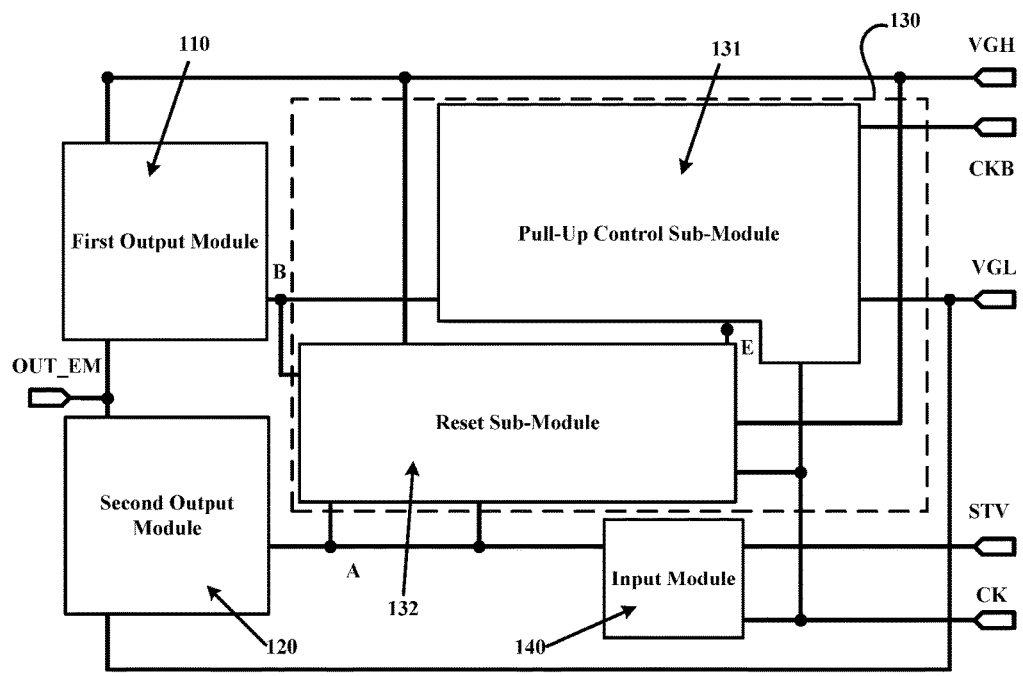
FIG. 2 is another schematic view showing the shift register unit according to one embodiment of the present disclosure.

Further, as shown in FIG. 2, which is another schematic view showing the shift register unit according to one embodiment of the present disclosure, the shift register unit may include additional members, so as to improve its performance.

Optionally, the control module 130 includes a pull-up control sub-module 131 and a reset sub-module 132. The pull-up control sub-module 131 is connected to the first clock signal end CKB, the second clock signal end CK, the second signal end VGL, the first node B and a third node E, and configured to control the potential at the first node B under the control of the second control signal from the second signal end VGL, a reset control signal from the third node E, the first clock signal from the first clock signal end CKB and the second clock signal from the second clock signal end CK. The reset sub-module 132 is connected to the first node B, the second node A, the third node E, the first signal end VGH and the second clock signal end CK, and configured to control the potentials at the first node B, the second node A, and the third node E, under the control of the first control signal from the first signal end VGH and the second clock signal from the second clock signal end CK.

Figure 3:
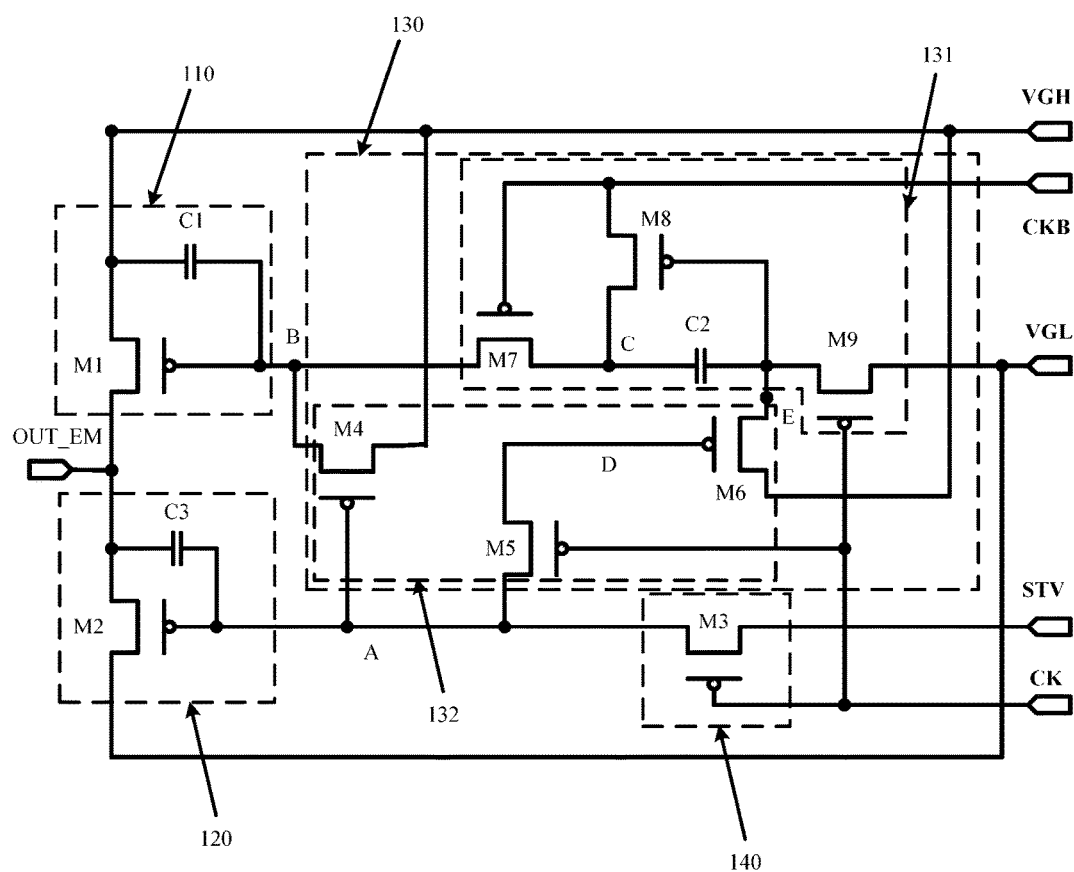
FIG. 3 is yet another schematic view showing the shift register unit according to one embodiment of the present disclosure.

FIG. 3 is yet another schematic view showing the shift register unit according to one embodiment of the present disclosure.

Optionally, the pull-up control sub-module 131 includes a second capacitor C2, a seventh transistor M7, an eighth transistor M8 and a ninth transistor M9. A first electrode of the seventh transistor M7 is connected to a fourth node C, a second electrode thereof is connected to the first node B, and a third electrode thereof is connected to the first clock signal end CKB. A second electrode of the eighth transistor M8 is connected to the fourth node C, a first electrode thereof is connected to the first clock signal end CKB, and a third electrode thereof is connected to the third node E. A second electrode of the ninth transistor M9 is connected to the third node E, a first electrode thereof is connected to the second signal end VGL, and a third electrode thereof is connected to the second clock signal end CK. A first electrode of the second capacitor C2 is connected to the third node E, and a second electrode thereof is connected to the fourth node C.

Optionally, the reset sub-module 132 includes a fourth transistor M4, a fifth transistor M5 and a sixth transistor M6. A second electrode of the fourth transistor M4 is connected to the first node B, a first electrode thereof is connected to the first signal end VGH, and a third electrode thereof is connected to the second node A. A first electrode of the fifth transistor M5 is connected to the second node A, a second electrode thereof is connected to a third electrode of the sixth transistor M6, and a third electrode thereof is connected to the second clock signal end CK. A second electrode of the sixth transistor M6 is connected to the third node E, and a first electrode thereof is connected to the first signal end VGH.

Optionally, the first output module 110 includes a first transistor M1 and a first capacitor C1. A first electrode of the first transistor M1 is connected to the first signal end VGH, a second electrode thereof is connected to the output end OUT_EM, and a third electrode thereof is connected to the first node B. A first electrode of the first capacitor C1 is connected to the first electrode of the first transistor M1, and a second electrode thereof is connected to the third electrode of the first transistor M1.

Optionally, the second output module 120 includes a second transistor M2 and a third capacitor C3. A first electrode of the second transistor M2 is connected to the second signal end VGL, a second electrode thereof is connected to the output end OUT_EM, and a third electrode thereof is connected to the second node A. A first electrode of the third capacitor C3 is connected to the second electrode of the second transistor M2, and a second electrode thereof is connected to the third electrode of the second transistor M2.

Optionally, the input module 140 includes a third transistor M3, a second electrode of which is connected to the second node A, a first electrode of which is connected to the input end STV, and a third electrode of which is connected to the second clock signal end CK.

It should be appreciated that, it is able for the shift register unit in the embodiments of the present disclosure to control the potentials at the output end through nine transistors and three capacitors, so as to simplify the shift register unit and reduce a layout area of the shift register, thereby to facilitate the manufacture of a high-resolution display device.

According to the shift register unit in the embodiments of the present disclosure, the potentials at the output end is controlled by the first output module, the second output module, the input module and the control module. As a result, it is able to simplify the shift register unit and its control procedure, thereby to adjust the output pulse width.

Figure 4:
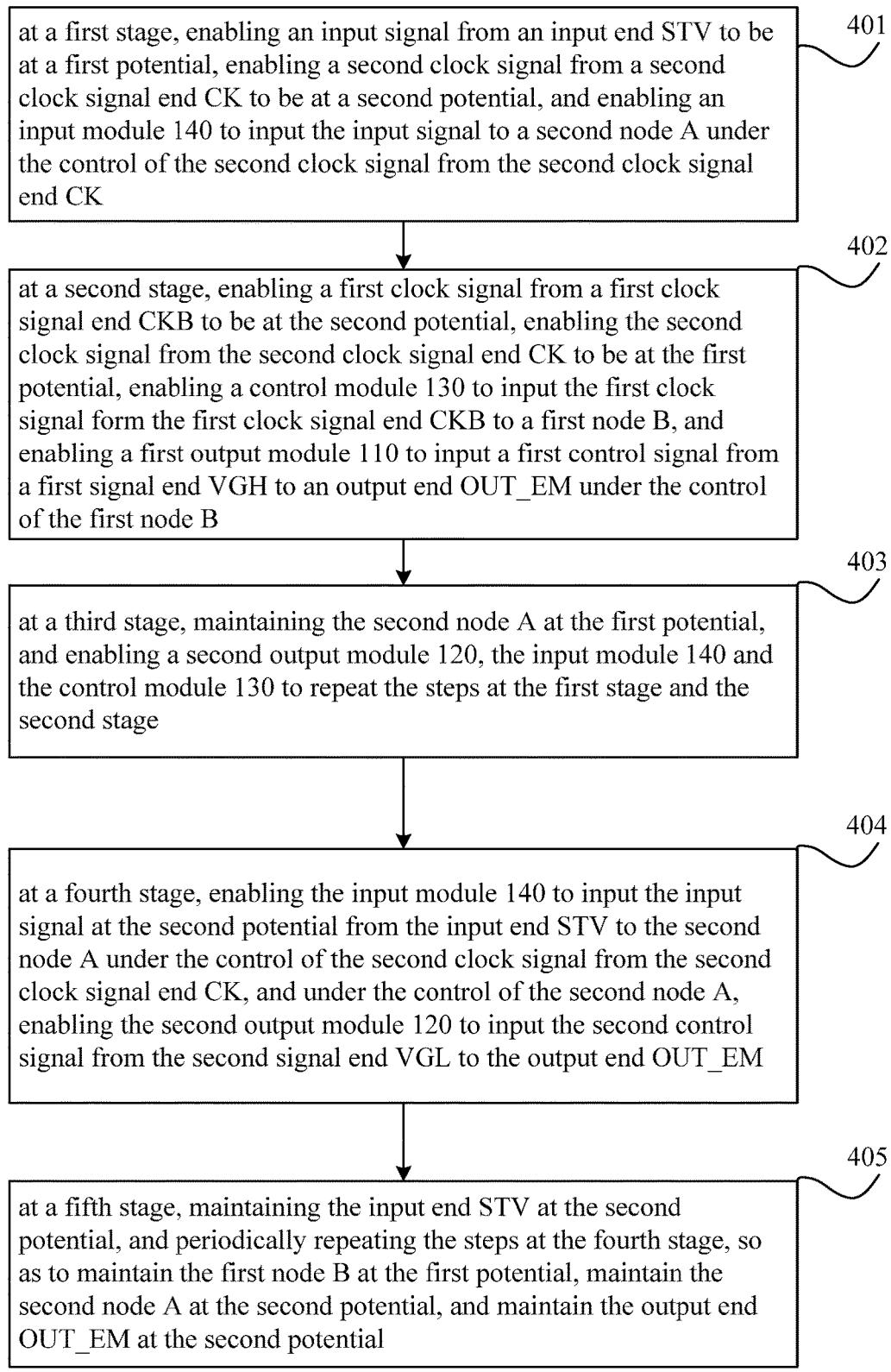
FIG. 4 is flow chart of a method for driving a shift register unit according to one embodiment of the present disclosure.

FIG. 4 is a flow chart of a method for driving the shift register unit according to one embodiment of the present disclosure. The shift register unit may include the first output module 110, the second output module 120, the control module 130 and the input module 140 as shown in FIG. 1. The driving method includes the following steps.

Figure 5:
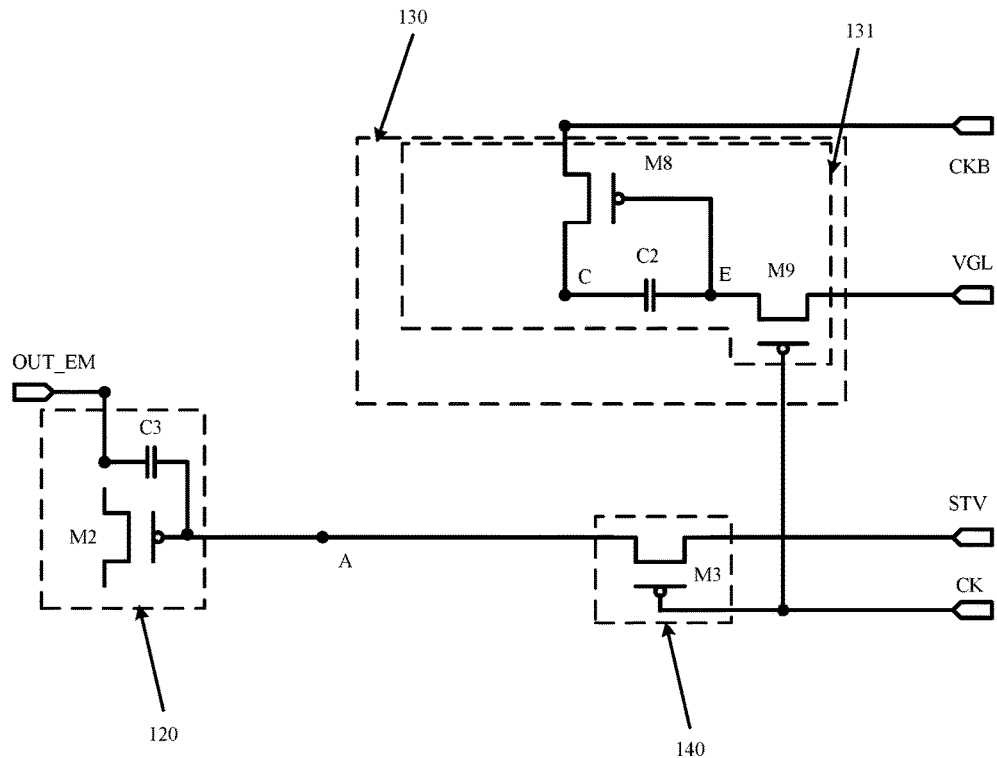
FIG. 5 is an equivalent circuit diagram of the shift register unit for the driving method in FIG. 4 at a first stage.

Step 401: at a first stage, enabling the input signal from the input end STV to be at a first potential, enabling the second clock signal from the second clock signal end CK to be at a second potential, and enabling the input module 140 to input the input signal to the second node A under the control of the second clock signal from the second clock signal end CK. FIG. 5 shows an equivalent circuit at the first stage, where reference signs represent the same elements as those in FIG. 3. The first stage is a preparation stage.

Figure 6:
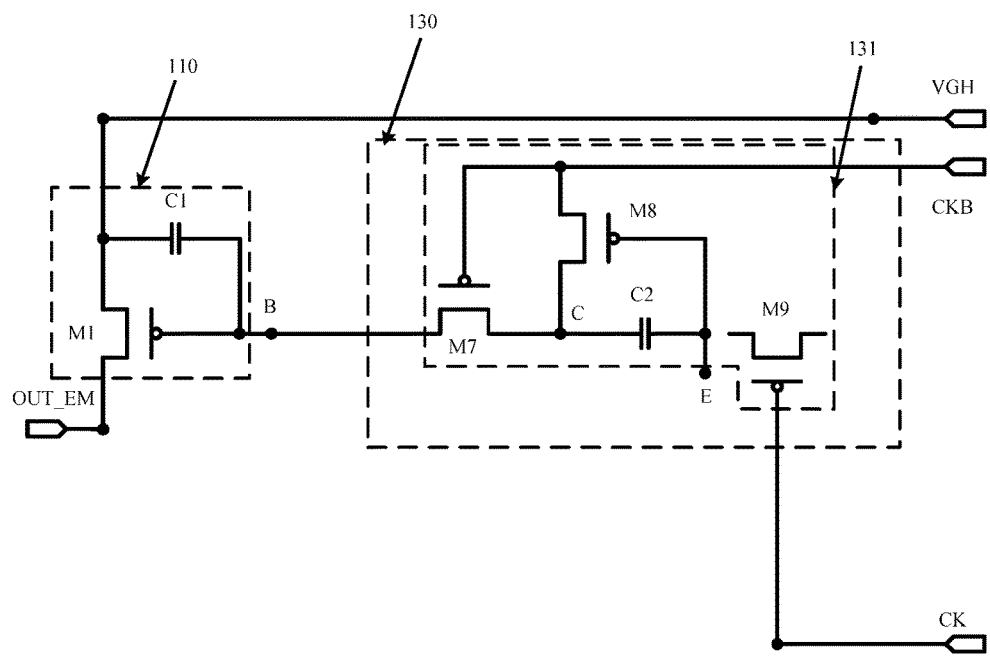
FIG. 6 is an equivalent circuit diagram of the shift register unit for the driving method in FIG. 4 at a second stage.

Step 402: at a second stage, enabling the first clock signal from the first clock signal end CKB to be at the second potential, enabling the second clock signal from the second clock signal end CK to be at the first potential, enabling the control module 130 to input the first clock signal form the first clock signal end CKB to the first node B, and enabling the first output module 110 to input the first control signal from the first signal end VGH to the output end OUT_EM under the control of the first node B. FIG. 6 shows an equivalent circuit at the second stage, where reference signs represent the same elements as those in FIG. 3. The second stage is a pull-up stage.

Figure 7:
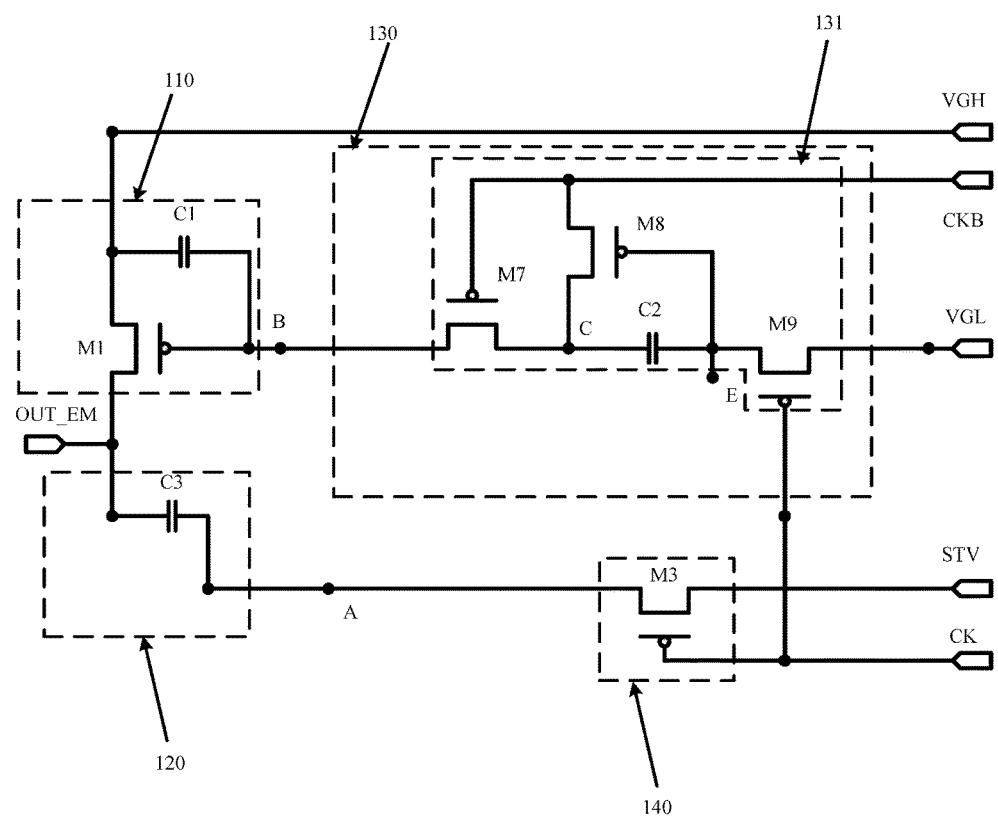
FIG. 7 is an equivalent circuit diagram of the shift register unit for the driving method in FIG. 4 at a third stage.

Step 403: at a third stage, maintaining the second node A at the first potential, and enabling the second output module 120, the input module 140 and the control module 130 to repeat the steps at the first stage and the second stage. FIG. 7 shows an equivalent circuit at the third stage, where reference signs represent the same elements as those in FIG. 3. The third stage is a high-potential-maintenance stage.

Figure 8:
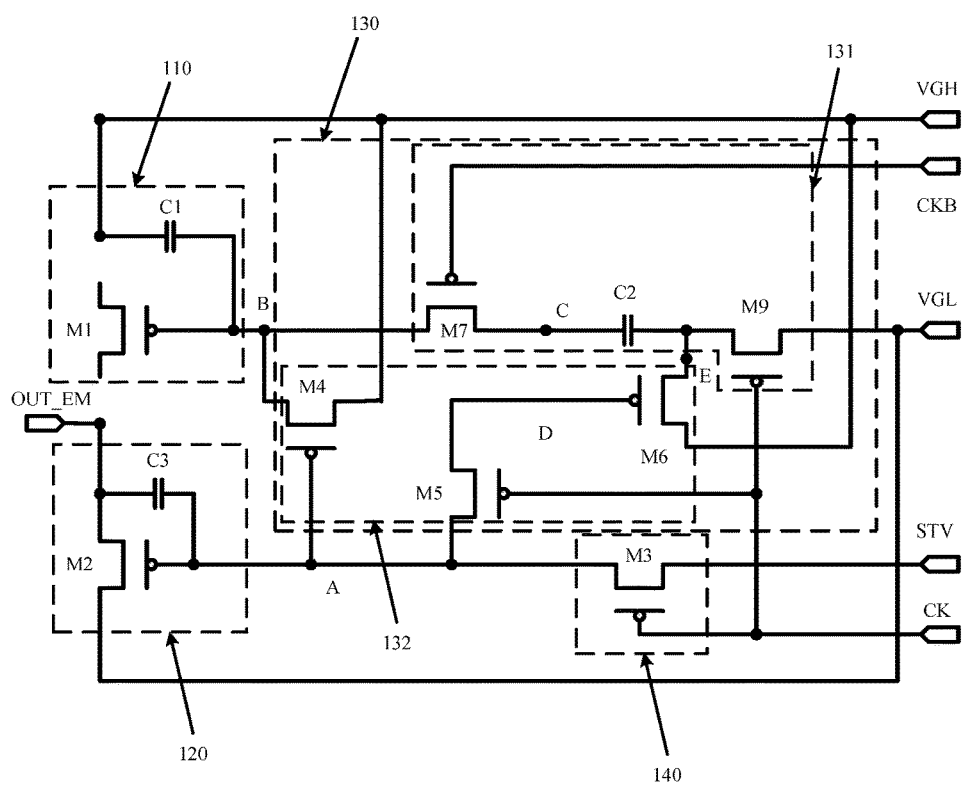
FIG. 8 is an equivalent circuit diagram of the shift register unit for the driving method in FIG. 4 at a fourth stage.

Step 404: at a fourth stage, enabling the input module 140 to input the input signal at the second potential from the input end STV to the second node A under the control of the second clock signal from the second clock signal end CK, and under the control of the second node A, enabling the second output module 120 to input the second control signal from the second signal end VGL to the output end OUT_EM. FIG. 8 shows an equivalent circuit at the fourth stage, where reference signs represent the same elements as those in FIG. 3. The fourth stage is a pull-down stage.

Figure 9:
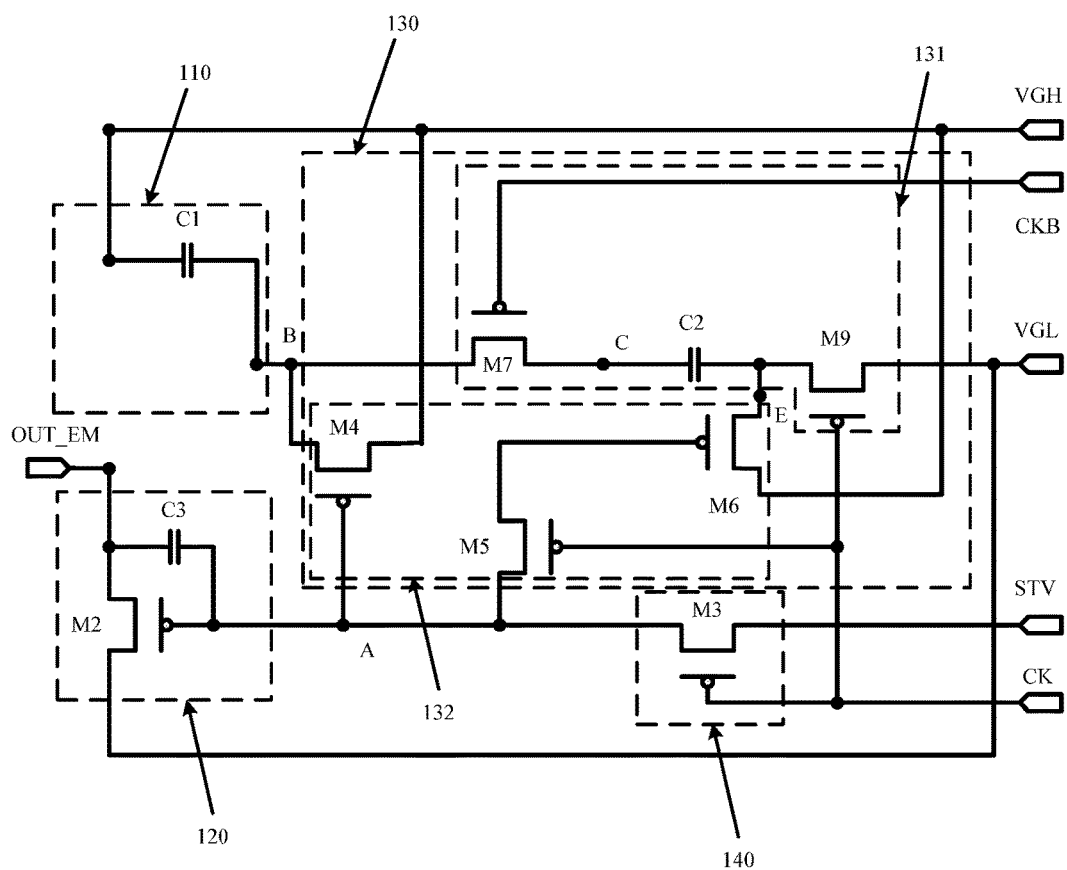
FIG. 9 is an equivalent circuit diagram of the shift register unit for the driving method in FIG. 4 at a fifth stage.

Step 405: at a fifth stage, maintaining the input end STV at the second potential, and periodically repeating the steps at the fourth stage, so as to maintain the first node B at the first potential, maintain the second node A at the second potential, and maintain the output end OUT_EM at the second potential. FIG. 9 shows an equivalent circuit at the fifth stage, where reference signs represent the same elements as those in FIG. 3. The fifth stage is a low-potential-maintenance stage.

According to the driving method in the embodiments of the present disclosure, it is able to control a maintenance time period of the input end STV at the first potential, thereby to control the potentials at the output end OUT_EM.

Optionally, as shown in FIG. 2, the control module 130 includes the pull-up control sub-module 131 and the reset sub-module 132. At this time, Step 402 may include: at the second stage, enabling the first clock signal end CKB to input the first clock signal at the second potential, and enabling the second clock signal end CK to input the second clock signal at the first potential, so as to enable the pull-up control sub-module 131 to reset the first node B to be at the second potential. FIG. 6 shows the equivalent circuit at the second stage. Step 404 may include: at the fourth stage, enabling the input end STV to input the input signal at the second potential, so as to enable the reset sub-module 132 to input the first control signal from the first signal end VGH to the third node E. FIG. 8 shows the equivalent circuit at the fourth stage.

Optionally, as shown in FIG. 3, the pull-up control sub-module 131 includes the second capacitor C2, the seventh transistor M7, the eighth transistor M8 and the ninth transistor M9. At this time, Step 401 may include: at the first stage, enabling the second clock signal end CK to input the second clock signal at the second potential, so as to turn on the ninth transistor M9, thereby to enable the second signal end VGL to input the second control signal to the third node E. FIG. 5 shows the equivalent circuit at the first state. Step 402 may include: at the second stage, enabling the first clock signal end CKB to input the first clock signal at the second potential, and enabling the second clock signal end CK to input the second clock signal at the first potential, so as to turn off the ninth transistor M9, and turn on the seventh transistor M7 and the eighth transistor M8, thereby to enable the first clock signal end CKB to input the first clock signal at the second potential to the fourth node C, and enable the fourth node C to input the second potential to the first node B. It should be appreciated that, the eighth transistor M8 is turned on and the fourth node C is pulled up to be at the first potential by the first clock signal end CKB at the first stage, so a negative potential is stored between the third node E and the fourth node C at both sides of the second capacitor C2. In the case that the first clock signal end CKB is jumped to be at the second potential, this second potential may be transferred to the fourth node C, and the potential at the third node E may be pulled down by the second capacitor C2, so as to turn on the eighth transistor M8 better. After the first clock signal end CKB is jumped to be at the first potential, the seventh transistor M7 is turned off, so the first potential at the first clock signal end CKB may not be transferred to the first node B. FIG. 6 shows the equivalent circuit at the second stage.

Optionally, the reset sub-module 132 includes the fourth transistor M4, the fifth transistor M5 and the sixth transistor M6. At the fourth stage, the second clock signal end CK is configured to input the second clock signal at the second potential, and the input module 140 is configured to input the input signal at the second potential from the input end STV to the second node A, so as to turn on the fourth transistor M4, the fifth transistor M5 and the sixth transistor M6, thereby to enable the first signal end VGH to input the first control signal to the first node B and the third node E. FIG. 8 shows the equivalent circuit at the fourth stage.

Optionally, the first output module 110 includes the first transistor M1 and the first capacitor C1. Step 402 may include: at the second stage, enabling the control module 130 to input the first clock signal at the second potential to the first node B, so as to turn on the first transistor M1 and charge the first capacitor C1, thereby to enable the first transistor M1 to input the first control signal from the first signal end VGH to the output end OUT_EM. Step 404 may include: at the fourth stage, enabling the control module 130 to input the first potential to the first node B, so as to turn off the first transistor M1. FIG. 8 shows the equivalent circuit at the fourth stage.

Optionally, the second output module 120 includes the second transistor M2 and the third capacitor C3. At this time, Step 401 may include: at the first stage, enabling the input module 140 to output the input signal at the first potential from input end STV to the second node A, so as to turn off the second transistor M2 and charge the third capacitor C3. FIG. 5 shows the equivalent circuit at the first stage. Step 404 may include: at the fourth stage, enabling the input module 140 to output the input signal at the second potential from the input end STV to the second node A, so as to turn on the second transistor M2, thereby to enable the second transistor M2 to output the second control signal from the second signal end VGL to the output end OUT_EM. FIG. 8 shows the equivalent circuit at the fourth stage.

Optionally, the input module 140 includes the third transistor M3. At this time, Step 401 may include: at the first stage, enabling the input end STV to output the input signal at the first potential, and enabling the second clock signal end CK to input the second clock signal at the second potential, so as to turn on the third transistor M3, thereby to enable the third transistor M3 to input the input signal from the input end STV to the second node A. FIG. 5 shows the equivalent circuit at the first stage. Step 403 may include: at the third stage, before the input signal from the input end STV is jumped to be at the second potential, turning off the third transistor M3 under the control of the second clock signal at the first potential from the second clock signal end CK. FIG. 7 shows the equivalent circuit at the third stage. Step 404 may include: at the fourth stage, enabling the second clock signal end CK to input the second clock signal at the second potential, so as to enable the third transistor M3 to output the input signal at the second potential from the input end STV to the second node A under the control of the second clock signal at the second potential from the second clock signal end CK, and in the case that the second clock signal from the second clock signal end CK is jumped to be at the first potential, turn off the third transistor M3. FIG. 8 shows the equivalent circuit at the fourth stage.

Figure 10:
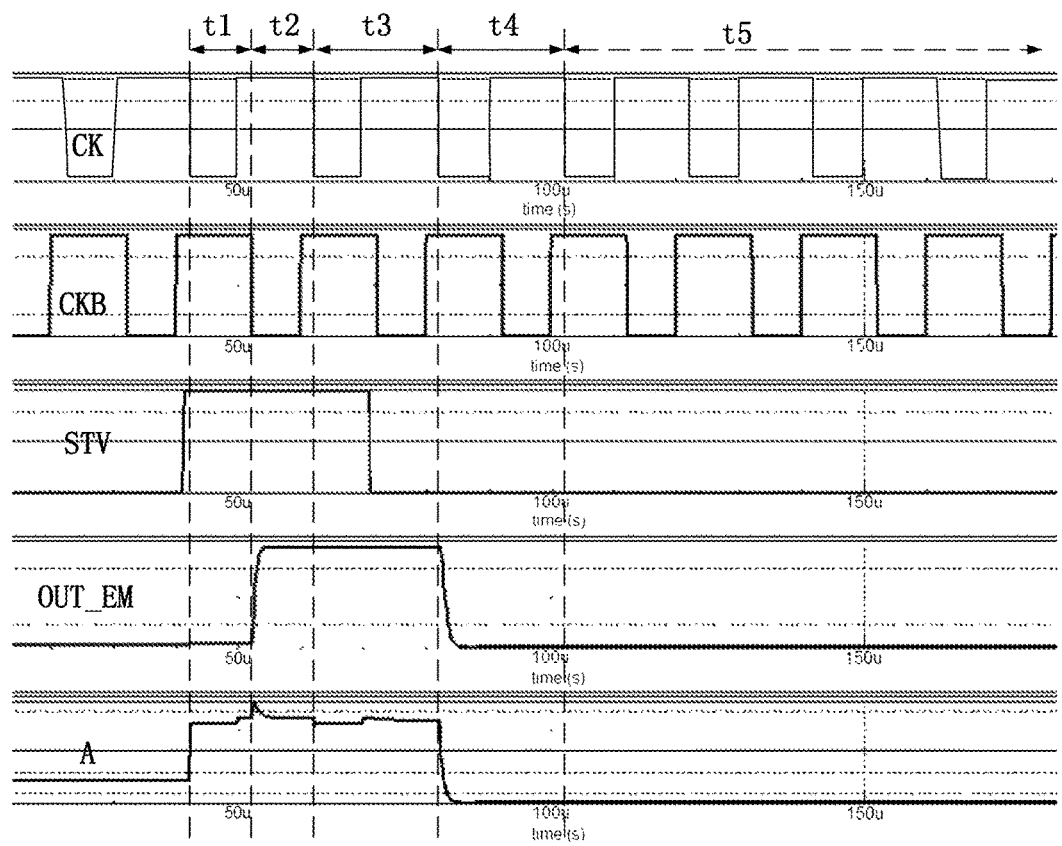
FIG. 10 is a schematic view showing potential changes at a first clock signal end, a second clock signal end, an input end, an output end, a first node, a second node, a third node and a fourth node according to one embodiment of the present disclosure.
Figure 10:
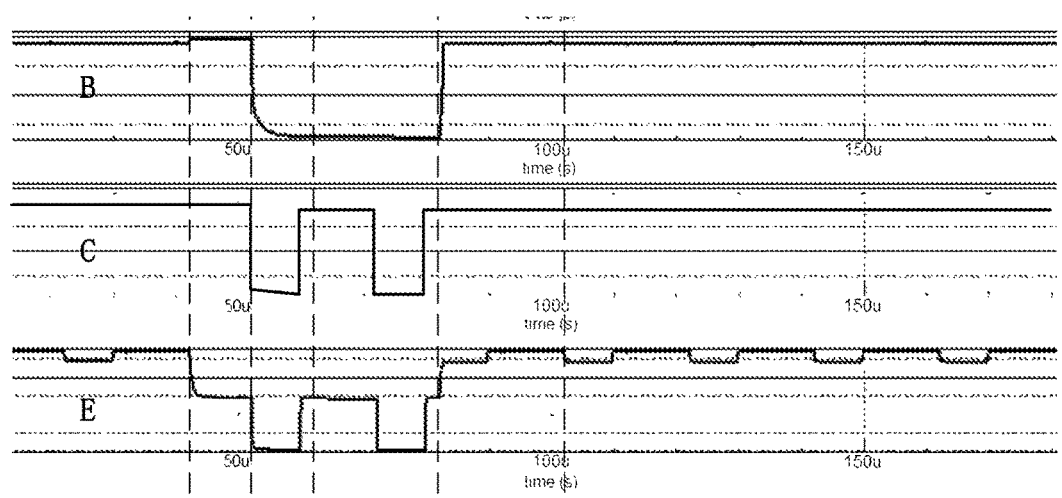

In addition, FIG. 10 shows the potential changes at the first clock signal end CKB, the second clock signal end CK, the input end STV, the output end OOT_EM, the first node B, the second A, the third node E and the fourth node C at the first stage t1, the second stage t2, the third stage t3, the fourth stage t4 and the fifth stage t5. In FIG. 10, a horizontal axis represents time, and a longitudinal axis presents potential.

It should be appreciated that, it is able for the shift register unit in the embodiments of the present disclosure to control the potentials at the output end through nine transistors and three capacitors, so as to simplify the shift register unit and reduce a layout area of the shift register, thereby to facilitate the manufacture of the high-resolution display device.

According to the driving method in the embodiments of the present disclosure, the potentials at the output end is controlled by the first output module, the second output module, the input module and the control module. As a result, it is able to simplify the shift register unit and its control procedure, thereby to adjust the output pulse width.

The present disclosure further provides in some embodiments a gate driver circuit, which includes at least two shift register units in FIG. 1, 2 or 3 connected to each other in a cascaded manner.

The present disclosure further provides in some embodiments a display device which includes the above-mentioned gate driver circuit. The display device may be any product or member having a display function, such as a liquid crystal panel, an electronic paper, an organic light-emitting diode panel, a mobile phone, a flat-panel computer, a television, a display, a laptop computer, a digital photo frame or a navigator.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A shift register unit, comprising a first output circuit, a second output circuit, an input circuit and a control circuit, wherein
the first output circuit is connected to a first signal end, a first node and an output end, and configured to output a first control signal from the first signal end to the output end under the control of the first node;
the second output circuit is connected to the output end, a second node and a second signal end, and configured to output a second control signal from the second signal end to the output end under the control of the second node;
the control circuit is connected to the first node, the second node, the first signal end, the second signal end, a first clock signal end and a second clock signal end, and configured to control potentials at the first node and the second node under the control of the first control signal from the first signal end, the second control signal from the second signal end, a first clock signal from the first clock signal end and a second clock signal from the second clock signal end; and
the input circuit is connected to an input end, the second node and the second clock signal end, and configured to output an input signal from the input end to the second node under the control of the second clock signal from the second clock signal end,
wherein the control circuit comprises a pull-up control sub-circuit and a reset sub-circuit,
wherein the pull-up control sub-circuit comprises a second capacitor, a seventh transistor, an eighth transistor and a ninth transistor;
a first electrode of the seventh transistor is directly connected to a fourth node, a second electrode of the seventh transistor is directly connected to the first node, and a third electrode of the seventh transistor is directly connected to the first clock signal end;
a second electrode of the eighth transistor is directly connected to the fourth node, a first electrode of the eighth transistor is directly connected to the first clock signal end, and a third electrode of the eighth transistor is directly connected to a third node;
a second electrode of the ninth transistor is directly connected to the third node, a first electrode of the ninth transistor is directly connected to the second signal end, and a third electrode of the ninth transistor is directly connected to the second clock signal end; and
a first electrode of the second capacitor is directly connected to the third node, and a second electrode of the second capacitor is directly connected to the fourth node,
wherein the reset sub-circuit comprises a fourth transistor, a fifth transistor and a sixth transistor;
a second electrode of the fourth transistor is directly connected to the first node, a first electrode of the fourth transistor is directly connected to the first signal end, and a third electrode of the fourth transistor is directly connected to the second node;
a first electrode of the fifth transistor is directly connected to the second node, a second electrode of the fifth transistor is directly connected to a third electrode of the sixth transistor, and a third electrode of the fifth transistor is directly connected to the second clock signal end; and
a second electrode of the sixth transistor is directly connected to the third node, and a first electrode of the sixth transistor is directly connected to the first signal end.

2. The shift register unit according to claim 1, wherein the first output circuit comprises a first transistor and a first capacitor;
a first electrode of the first transistor is connected to the first signal end, a second electrode of the first transistor is connected to the output end, and a third electrode of the first transistor is connected to the first node; and
a first electrode of the first capacitor is connected to the first electrode of the first transistor, and a second electrode of the first capacitor is connected to the third electrode of the first transistor.

3. The shift register unit according to claim 2, wherein the first transistor is a P-type transistor.

4. The shift register unit according to claim 1, wherein the second output circuit comprises a second transistor and a third capacitor;
a first electrode of the second transistor is connected to the second signal end, a second electrode of the second transistor is connected to the output end, and a third electrode of the second transistor is connected to the second node; and
a first electrode of the third capacitor is connected to the second electrode of the second transistor, and a second electrode of the third capacitor is connected to the third electrode of the second transistor.

5. The shift register unit according to claim 1, wherein the input circuit comprises a third transistor, a second electrode of which is connected to the second node, a first electrode of which is connected to the input end, and a third electrode of which is connected to the second clock signal end.

6. A method for driving the shift register unit according to claim 1, wherein the shift register unit comprises the first output circuit, the second output circuit, the input circuit and the control circuit, and the method comprises steps of:
at a first stage, enabling an input signal from an input end to be at a first potential, enabling a second clock signal from a second clock signal end to be at a second potential, and enabling the input circuit to input the input signal to a second node under the control of the second clock signal from the second clock signal end;
at a second stage, enabling a first clock signal from a first clock signal end to be at the second potential, enabling the second clock signal from the second clock signal end to be at the first potential, enabling the control circuit to input the first clock signal form the first clock signal end to a first node, and enabling the first output circuit to input a first control signal from a first signal end to an output end under the control of the first node;
at a third stage, maintaining the second node at the first potential, and enabling the second output circuit, the input circuit and the control circuit to repeat the steps at the first stage and the second stage; and
at a fourth stage, enabling the input circuit to input the input signal at the second potential from the input end to the second node under the control of the second clock signal from the second clock signal end, and under the control of the second node, enabling the second output circuit to input a second control signal from a second signal end to the output end and enabling the control circuit to input the first control signal from the first signal end to the first node.

7. The method according to claim 6, wherein the first output circuit comprises a first transistor and a first capacitor;
at the second stage, the control circuit is configured to input the first clock signal at the second potential from the first clock signal end to the first node, so as to turn on the first transistor and charge the first capacitor, thereby to enable the first transistor to input the first control signal from the first signal end to the output end; and
at the fourth stage, the control circuit is configured to input the first control signal from the first signal end to the first node, so as to turn off the first transistor.

8. The method according to claim 7, wherein the first transistor is a P-type transistor.

9. The method according to claim 6, wherein the second output circuit comprises a second transistor and a third capacitor;
at the first stage, the input circuit is configured to output the input signal at the first potential from input end to the second node, so as to turn off the second transistor and charge the third capacitor; and
at the fourth stage, the input circuit is configured to output the input signal at the second potential from the input end to the second node, so as to turn on the second transistor, thereby to enable the second transistor to output the second control signal from the second signal end to the output end.

10. The method according to claim 6, wherein the control circuit comprises a pull-up control sub-circuit and a reset sub-circuit;
at the second stage, the first clock signal end is configured to input the first clock signal at the second potential, and the second clock signal end is configured to input the second clock signal at the first potential, so as to enable the pull-up control sub-circuit to reset the first node to be at the second potential; and
at the fourth stage, the input end is configured to input the input signal at the second potential, so as to enable the reset sub-circuit to input the first control signal from the first signal end to the third node.

11. The method according to claim 10, wherein the pull-up control sub-circuit comprises a second capacitor, a seventh transistor, an eighth transistor and a ninth transistor;
at the first stage, the second clock signal end is configured to input the second clock signal at the second potential, so as to turn on the ninth transistor, thereby to enable the second signal end to input the second control signal to the third node; and
at the second stage, the first clock signal end is configured to input the first clock signal at the second potential, and the second clock signal end is configured to input the second clock signal at the first potential, so as to turn off the ninth transistor, and turn on the seventh transistor and the eighth transistor, thereby to enable the first clock signal end to input the first clock signal to a fourth node, enable the fourth node to reset the first node to be at the second potential, and after the first clock signal from the first clock signal end is jumped to be at the first potential, turn off the seventh transistor.

12. The method according to claim 10, wherein the reset sub-circuit comprises a fourth transistor, a fifth transistor and a sixth transistor; and
at the fourth stage, the second clock signal end is configured to input the second clock signal at the second potential, and the input circuit is configured to input the input signal at the second potential from the input end to the second node, so as to turn on the fourth transistor, the fifth transistor and the sixth transistor, thereby to enable the first signal end to input the first control signal to the first node and the third node.

13. The method according to claim 6, wherein the input circuit comprises a third transistor;
at the first stage, the input end is configured to output the input signal at the first potential, and the second clock signal end is configured to input the second clock signal at the second potential, so as to turn on the third transistor, thereby to enable the third transistor to input the input signal from the input end to the second node;
at the third stage, before the input signal from the input end is jumped to be at the second potential, the third transistor is turned off under the control of the second clock signal at the first potential from the second clock signal end; and
at the fourth stage, the second clock signal end is configured to input the second clock signal at the second potential, so as to enable the third transistor to output the input signal at the second potential from the input end to the second node under the control of the second clock signal at the second potential from the second clock signal end, and in the case that the second clock signal from the second clock signal end is jumped to be at the first potential, turn off the third transistor.

14. The method according to claim 6, wherein the first potential is a high potential relative to the second potential.

15. A gate driver circuit, comprising at least two shift register units according to claim 1 and connected to each other in a cascaded manner.

16. A display device, comprising the gate driver circuit according to claim 15.

17. The gate driver circuit according to claim 15, wherein the first output circuit comprises a first transistor and a first capacitor;
a first electrode of the first transistor is connected to the first signal end, a second electrode of the first transistor is connected to the output end, and a third electrode of the first transistor is connected to the first node; and
a first electrode of the first capacitor is connected to the first electrode of the first transistor, and a second electrode of the first capacitor is connected to the third electrode of the first transistor.

* * * * *